United States Patent
Selter et al.

(10) Patent No.: US 12,557,207 B2
(45) Date of Patent: Feb. 17, 2026

(54) MULTI-LAYERED DIAMOND-LIKE CARBON COATING FOR ELECTRONIC COMPONENTS

(71) Applicant: Honeywell Federal Manufacturing & Technologies, LLC, Kansas City, MO (US)

(72) Inventors: Thomas Matthew Selter, Blue Springs, MO (US); Michael Alan Walsh, Overland Park, KS (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 263 days.

(21) Appl. No.: 18/326,672

(22) Filed: May 31, 2023

(65) Prior Publication Data

US 2023/0309213 A1 Sep. 28, 2023

Related U.S. Application Data

(63) Continuation-in-part of application No. 17/380,443, filed on Jul. 20, 2021, now Pat. No. 11,729,909.

(51) Int. Cl.
*H05K 1/02* (2006.01)

(52) U.S. Cl.
CPC ... *H05K 1/0218* (2013.01); *H05K 2201/0175* (2013.01); *H05K 2201/0715* (2013.01)

(58) Field of Classification Search
CPC ......... H05K 1/0218; H05K 2201/0175; H05K 2201/0715
See application file for complete search history.

(56) References Cited

U.S. PATENT DOCUMENTS

| | | | |
|---|---|---|---|
| 2009/0237900 A1* | 9/2009 | Origuchi | H01L 23/49838 361/763 |
| 2009/0266599 A1* | 10/2009 | Kan | C23C 16/26 205/261 |

OTHER PUBLICATIONS

Jinyoung Kim, et al., "Fabrication Of Highly Flexible Electromagnetic Interference Shielding Polyimide Carbon Black Composite Using Hot-Pressing Method", Composites Part B: Engineering, vol. 221, Sep. 15, 2021, https://doi.org/10.1016/j.compositesb.2021.109010.

* cited by examiner

*Primary Examiner* — Jeremy C Norris
(74) *Attorney, Agent, or Firm* — Erise IP, P.A.

(57) ABSTRACT

A multi-layer coating on an outer surface of a substrate includes a first layer applied directly to the outer surface of the substrate. The first layer includes diamond-like carbon (DLC) configured to mitigate metal whisker formation. A second layer is applied on a top surface of the first layer. The second layer is a conformal coating that includes a second material configured to bind to the top surface of the first layer and fill any microfractures that may form in the first layer. Optionally, a third layer is applied on a top surface of the second layer and includes DLC configured to protect the second layer from oxidation and degradation.

20 Claims, 5 Drawing Sheets

MULTI-LAYERED DIAMOND-LIKE CARBON COATING FOR ELECTRONIC COMPONENTS

STATEMENT OF GOVERNMENTAL SUPPORT

This invention was made with government support under DE-NA0002839 awarded by the United States Department of Energy/National Nuclear Security Administration. The government has certain rights in the invention.

RELATED APPLICATION

The present application is a continuation-in-part application claiming priority benefit, with regard to all common subject matter, of similarly titled U.S. Patent Application Publication No. 2023/0025748, filed Jul. 20, 2021. The above-referenced patent application is hereby incorporated by reference in its entirety into the present application.

BACKGROUND

1. Field

Embodiments of the invention relate to a system having a multi-layered coating including diamond-like carbon (DLC) and a method for manufacturing conformal coatings including DLC. More specifically, embodiments of the invention relate to multi-layered conformal coatings including DLC for use on electronic components.

2. Related Art

The general use of DLC coatings in electronic components is known. For example, U.S. Pat. No. 8,227,812 to Sung discloses using a DLC coating in the formation of electronic components including a conductive cathode/anode. U.S. Pat. No. 6,086,796 to Brown et al. discloses a method for manufacturing a protective DLC overcoat for optical recording media devices. U.S. Patent App. Pub. No. 2020/0378011 to Hendrix et al. discloses coatings for enhancing substrates used in semiconductor manufacturing, including an overlying coating layer of DLC. U.S. Pat. No. 8,947,826 to Bhatia et al. discloses using DLC as an overcoat to provide wear-resistance for a magnetic recording system.

Electronic components are subject to metal whiskering in which whisker-like projections of metal form over time. Metal whiskers may be caused by stress formation, oxidation, or a combination thereof. Extension of metal whiskers between electrical components may cause a short circuit. Thus, efforts to mitigate metal whiskering are employed to extend the longevity of electronic devices.

Solder joints in electronic components are formed from a metal or metal alloy that has a lower melting temperature than the metals forming the electronic components that are to be soldered together. This enables the solder material to be melted and applied at an electrical junction to attach the components together. For example, melted solder material may be applied between a first electronic component and a printed-circuit board (PCB). When the solder material cools, the first electronic component is electrically and mechanically coupled to the PCB. A common problem is that metal whiskers often form on solder joints. For example, tin and tin alloys, which are common soldering materials, form "tin whiskers".

Different strategies have been used to prevent or mitigate the formation of metal whiskers in electronic components. For example, conformal coatings formed of ceramic or polymeric compounds are often used. Example materials used in conformal coatings include polyurethane, polyacrylate, acrylic resin, polysulfide, silicone rubber, and epoxies. An entire PCB may be dipped, brushed, or sprayed with a conformal coating after the electronic components have been soldered to the board. Alternatively, a conformal coating compound may be sputtered onto the PCB or electronic components in a vacuum chamber.

Conformal coatings provide electrical insulation between electronic components and provide protection from environmental sources of degradation. Conformal coatings may deter whisker growth somewhat to prevent short circuiting between electrical components. However, the conformal coatings themselves are subject to oxidation and degradation over time, and therefore may only temporarily slow whisker growth.

Alternatively, or in addition to conformal coatings, alterations to the metal chemistry may help mitigate metal whiskering. For example, the addition of lead to tin is known to reduce tin whiskering. However, the use of lead in tin solder is undesirable due to its toxicity. For example, the European Union has banned the use of lead in most consumer electronic products since 2006. In another example, plating of electrical components with another metal (e.g., nickel, gold, or palladium) may reduce metal whiskering.

SUMMARY

Embodiments of the invention solve the above-mentioned problems by providing diamond-like carbon (DLC) coatings within conformal coatings used on electronic components. More specifically, embodiments of the invention are directed to multi-layered conformal coatings formed on electronic components having DLC integrated therein.

A first embodiment of the invention is directed to a substrate having a multi-layer coating on an outer surface thereof, the multi-layer coating including a first layer applied directly to the outer surface of the substrate. The first layer comprises diamond-like carbon (DLC) configured to mitigate metal whisker formation. A second layer is applied on a top surface of the first layer. The second layer is a conformal coating comprising a second material configured to bind to the top surface of the first layer. The conformal coating is configured to fill any microfractures that may form in the first layer.

A second embodiment of the invention is directed to a method of forming a multi-layer coating on a substrate, including depositing a first layer directly on the substrate. The first layer includes diamond-like carbon (DLC) and is configured to prevent metal whisker formation. The method further includes depositing a second layer on a top surface of the first layer. The second layer includes an organic polymer material configured to fill microcracks in the first layer.

A third embodiment of the invention is directed to an electronic device that includes an electronic component having an outer surface. A first layer on the outer surface of the electronic component includes diamond-like carbon (DLC) configured to mitigate metal whisker formation. A second layer on a top surface of the first layer is a conformal coating including a second material configured to bind to the top surface of the first layer. A third layer on a top surface of the second layer includes diamond-like carbon (DLC) configured to protect the second layer from oxidation and degradation.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the invention will be apparent from the following detailed description of the embodiments and the accompanying drawing figures.

BRIEF DESCRIPTION OF THE DRAWING FIGURES

Embodiments of the invention are described in detail below with reference to the attached drawing figures, wherein.

Figure 1:
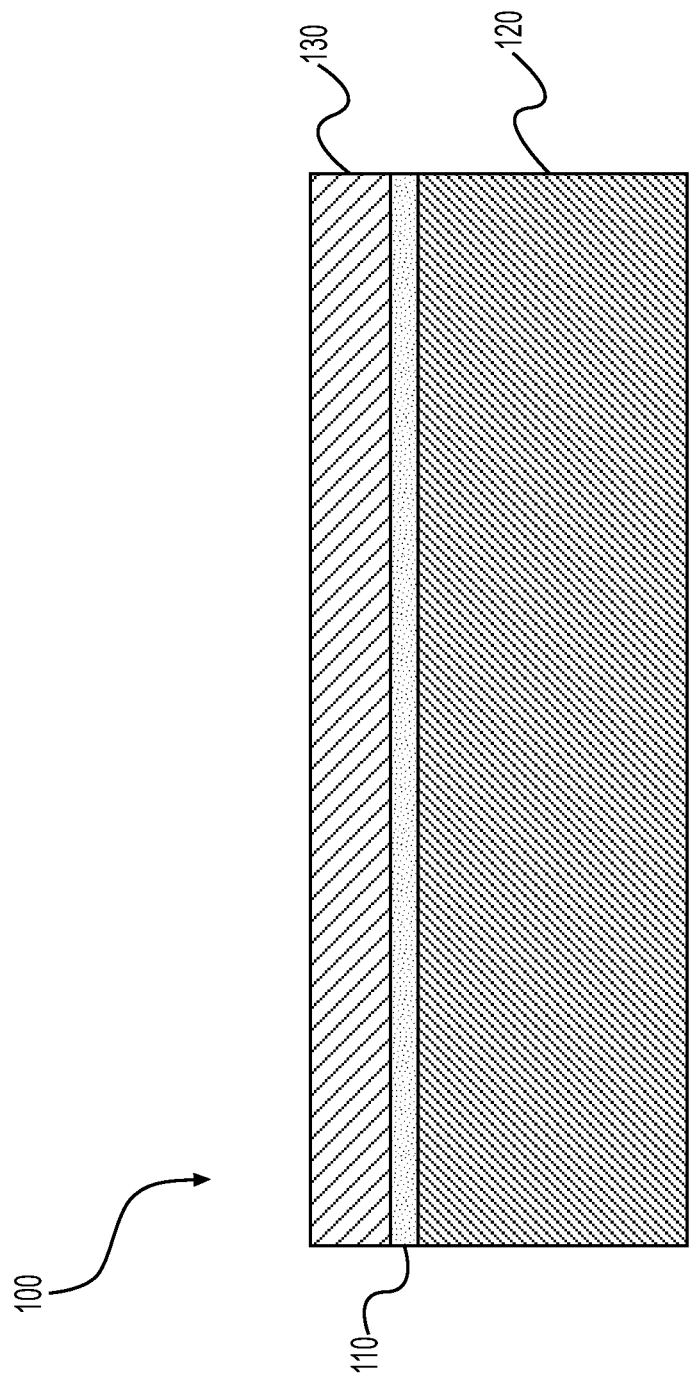
FIG. 1 illustrates a first embodiment of a multi-layered diamond-like carbon (DLC) coating for electronic components.

The drawing figures do not limit the invention to the specific embodiments disclosed and described herein. The drawings are not necessarily to scale, emphasis instead being placed upon clearly illustrating the principles of the invention.

DETAILED DESCRIPTION

The following detailed description references the accompanying drawings that illustrate specific embodiments in which the invention can be practiced. The embodiments are intended to describe aspects of the invention in sufficient detail to enable those skilled in the art to practice the invention. Other embodiments can be utilized, and changes can be made without departing from the scope of the invention. The following detailed description is, therefore, not to be taken in a limiting sense. The scope of the invention is defined only by the appended claims, along with the full scope of equivalents to which such claims are entitled.

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments but is not necessarily included. Thus, the technology can include a variety of combinations and/or integrations of the embodiments described herein.

FIG. 1 illustrates an exemplary, multi-layered coating 100 for electronic components. In the embodiment depicted in FIG. 1, multi-layered coating 100 includes two layers applied on substrate 120. In some embodiments, a first layer 110 is applied to a top surface of substrate 120. First layer 110 may comprise diamond-like carbon (DLC). Then, a second layer 130 is applied to a top surface of first layer 110. Second layer 130 may be a conformal coating.

FIG. 1 is not drawn to scale but rather is intended to provide an illustrative example of the embodiments disclosed herein. For example, substrate 120 is typically on the order of millimeters thick, whereas the first layer 110 is on the order of microns thick (e.g., ~1000-fold smaller), providing a size discrepancy that is impractical to accurately illustrate in the drawings.

In some embodiments, substrate 120 may be a printed circuit board (PCB). In some embodiments, substrate 120 may be made of an electrically insulating material such as an epoxy. However, other features of electronic components may serve as substrate 120 without departing from the scope hereof. For example, metals, plastics, silicon, and other materials typically found in electronic components (e.g., resistors, capacitors, transistors, switches, microcontrollers, integrated circuits, etc.) may form substrate 120 to be coated with coating 100 as described herein.

In prior systems, a silicate ($SiO_4$) layer was applied to a substrate 120 beneath a conformal coating material in order to improve bonding of the conformal coating to the substrate. However, exposure of silicate to water causes an oxide to form that may contribute to metal whisker formation and growth. Therefore, as the conformal coating degrades over time, water may penetrate the conformal coating and reach the silicate layer causing oxide formation. The first layer 110 of the present invention, which may comprise DLC, is not subject to oxidation and therefore alleviates this potential problem.

In embodiments disclosed herein, a first layer 110 is deposited directly on the substrate 120, instead of the prior silicate layer. The first layer 110 comprising DLC itself easily bonds to various substrates 120. Additionally, many conformal coating materials bond well to the DLC forming first layer 110. For example, DLC bonds well to substrates 120 made of metals, certain plastics, silicon, epoxy boards, and other materials typically found in electronic components. Therefore, the first layer 110 itself provides improved bonding of the second layer 130 to the substrate 120 without the necessity of a silicate layer.

Once the first layer 110 has been applied, the second layer 130 forming a conformal coating is applied on top of the first layer 110 using conventional techniques, such as dipping, brushing, spraying or sputtering. Various types of conformal coatings may be used, including many conformal coatings that are conventionally used to coat electronic components and PCBs. For example, conformal coatings formed of polymeric organic compounds adhere well to DLC layers. Therefore, the first layer 110 renders a silicate layer applied at a bonding site of a substrate unnecessary. However, other types of surface treatments may be applied to the substrate 120 prior to applying a first layer 110 without departing from the scope hereof. For example, cleaning of the substrate surface may be performed with one or more treatments known to those skilled in the art, such as a plasma-based treatment. In some embodiments, cleaning treatments are used to remove residual processing materials on the substrate (e.g., from processing of PCBs) and to dry the substrate surface. In some embodiments, plasma-based treatments may be used to help activate the surface of the substrate prior to deposition of DLC.

First layer 110, which may be formed of DLC, is configured to prevent or substantially reduce growth of metal whiskers as well as to provide electrical insulation between electronic components. In terms of electrical insulation, DLC coatings may provide dielectric standoff values up to about 500-volts-direct-current (VDC). In terms of prevention/reduction of metal whiskers, the DLC provides a hard layer that resists penetration by metal whiskers, thereby preventing their growth. The hardness of DLC layers can vary based on the addition of dopants and the method of coating deposition. Typical DLC coatings may range from about 1000-HV to about 9000-HV, although measurement of DLC coatings by standard indention or nanoindentation techniques is sometimes difficult due to the high degree of hardness and thin layers of DLC coatings. The first layer 110 of DLC may also reduce stresses in the substrate and oxidation of metal, both of which may otherwise contribute to whisker formation.

For a true DLC coating material (e.g., a material having only DLC without addition of dopants), thin layers of material reduce cracking of the coating due to the hardness of DLC. In some embodiments, the thickness of the first layer 110 applied is less than about 5 microns. In some embodiments, the first layer 110 is about 1 micron thick to about 5 microns thick. In other embodiments, the first layer 110 is sub-micron thick (e.g., about 0.1 micron to about 0.9 micron thick) to about 3 microns thick.

In some embodiments, the DLC material may be hydrogenated to provide a desired $sp^2/sp^3$ ratio. $Sp^2$ and $sp^3$ refer to crystalline polytypes of diamond, with $sp^2$ having a cubic lattice (graphite) providing low friction and $sp^3$ having a hexagonal lattice (diamond) providing high hardness. The $sp^2/sp^3$ ratio may be altered depending on how the DLC coatings are formed. In some embodiments, the $sp^3$ content of the DLC layer is in the range of about 45%-65% and the hydrogen content is in the range of about 20%-35%. However, other ratios of $sp^2/sp^3/H$ may be employed without departing from the scope hereof. In certain embodiments, the DLC layer is in the "ta-C:H" (tetrahedral amorphous carbon) region. In other embodiments, the DLC layer is in the "a-C:H" (amorphous hydrogenated carbon) region.

Alternatively, dopants may be added to the DLC material to make the coating layer softer. The silicon dopant integrates into the amorphous carbon network of the DLC material, which disrupts the C—C bonding, thereby reducing the hardness of the DLC material. For example, in some embodiments, a pure DLC material having a hardness of about 22 GPa may be doped with silicon to provide a DLC layer having a hardness of about 16 GPa. Addition of silicon dopant is sufficient to substantially reduce formation of microfractures or microcracks in the first layer 110. This enables formation of thicker coatings without the coatings being subject to cracking due to internal stress. For example, first layer 110 comprising silicon-doped DLC may be formed having a thickness of up to about 10 microns. However, in some embodiments, thinner layers of DLC without dopants that have a higher degree of hardness are provided, since hardness of DLC coatings provides resistance to penetration by metal whiskers.

In some embodiments, first layer 110 includes varying amounts of silicon added to the DLC material during deposition such that the amount of silicon varies throughout the structure of the DLC layer. In certain embodiments, a gradient of silicon dopant may be formed in which the amount of silicon decreases from the bottom to the top of first layer 110. For example, at a base of first layer 110, silicon may comprise up to about 15% of the overall material, whereas a top portion of first layer 110 may comprise less than 1% silicon and greater than 99% DLC. By varying the amount of silicon throughout first layer 110, internal stress in the DLC layer may be further alleviated.

Second layer 130 is applied on top of first layer 110. Second layer 130 may be between about 20 microns thick to about 250 microns thick, depending on what type of material is used. In embodiments where softer materials are used, the second layer 130 will generally be thicker than in embodiments where harder materials are used. A wide variety of materials could be used to form the second layer 130, including organic polymers such as polyurethane, polyacrylate, polysulfide, acrylic resins, and epoxy resins. DLC coatings tend to form microcracks due to internal stresses. By applying second layer 130 on top of first layer 110 of DLC, the material of the second layer 130 fills in any microcracks that may occur, while also binding to the DLC material.

Figure 2:
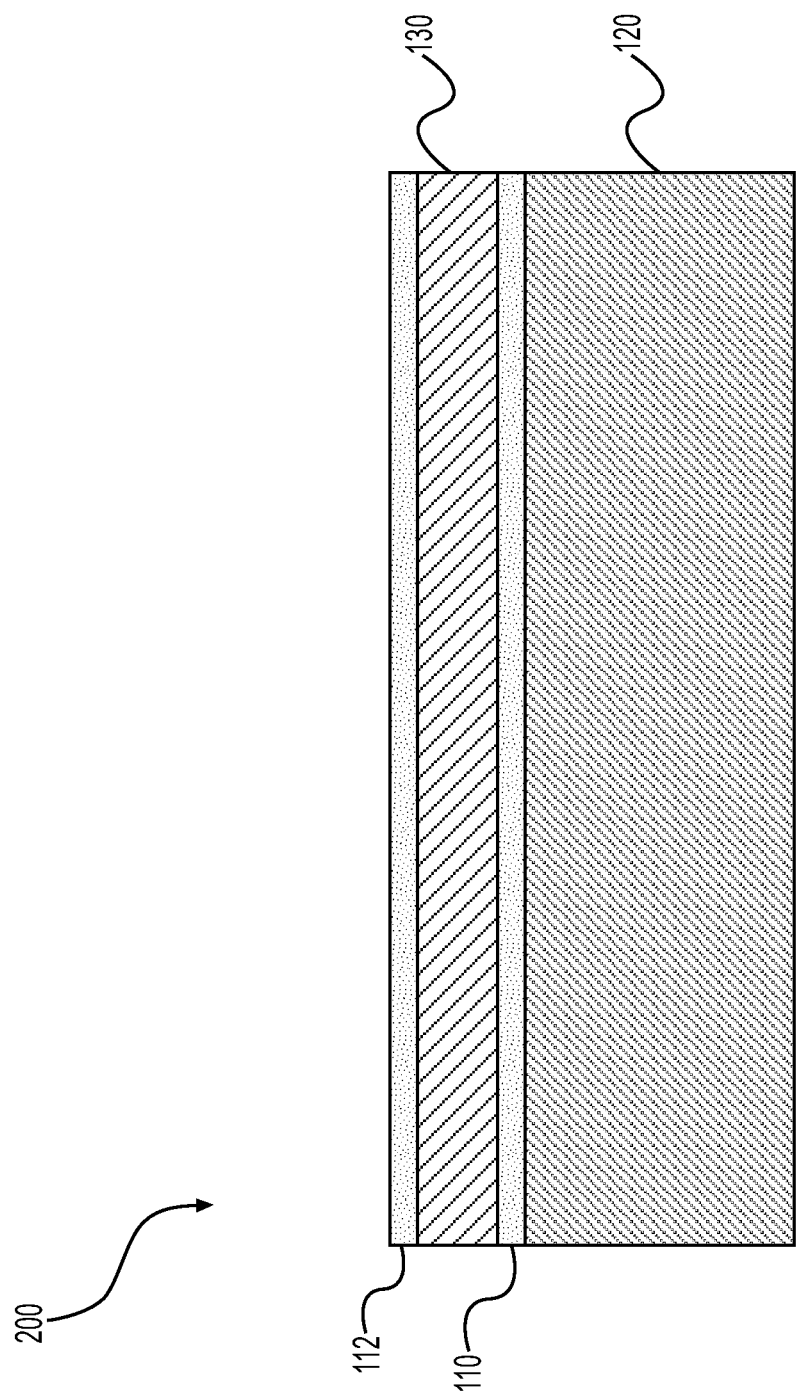
FIG. 2 illustrates another embodiment of a multi-layered DLC coating for electronic components.

FIG. 2 illustrates an exemplary, multi-layered coating 200 for electronic components, having three layers. First layer 110 is applied directly to a top surface of substrate 120. First layer 110 may comprise DLC. Then, second layer 130 is applied to a top surface of first layer 110. Second layer 130 may be a conformal coating. After the conformal coating has dried, a third layer 112 is then applied to a top surface of second layer 130. Third layer 112 may also comprise DLC.

In some embodiments, third layer 112 may be the same composition as first layer 110. In other embodiments, third layer 112 may be a different composition that first layer 110. Third layer 112 may comprise a DLC coating that provides an overcoat on a top surface of second layer 130. Third layer 112 protects second layer 130 by reducing degradation and oxidation of the material of second layer 130 over time.

In some embodiments, third layer 112 is thicker than first layer 110. A thicker layer provides additional protection, and formation of microfractures in third layer 112 are less critical as compared to first layer 110 because microfractures in third layer 112 are not in direct contact with the substrate surface where potential metal whiskering may develop. Additionally, propagation of any microfractures that form in third layer 112 are mitigated by the softer second layer 130.

In some embodiments, first layer 110 comprises DLC including a dopant and third layer 112 comprises DLC but does not include a dopant. The dopant (e.g., silicon) added to first layer 110 softens the material which aids in adhesion to substrate 120 and reduces microfractures. Since second layer 130 is typically softer than substrate 120, third layer 112 may be applied to second layer 130 without requiring a dopant to provide a hard surface, which may still avoid the formation of microfractures. In other embodiments, first layer 110 and third layer 112 may both comprise DLC including dopants. In some embodiments, third layer 112 comprises DLC including a dopant and first layer 110 comprises DLC but does not include a dopant.

Figure 3:
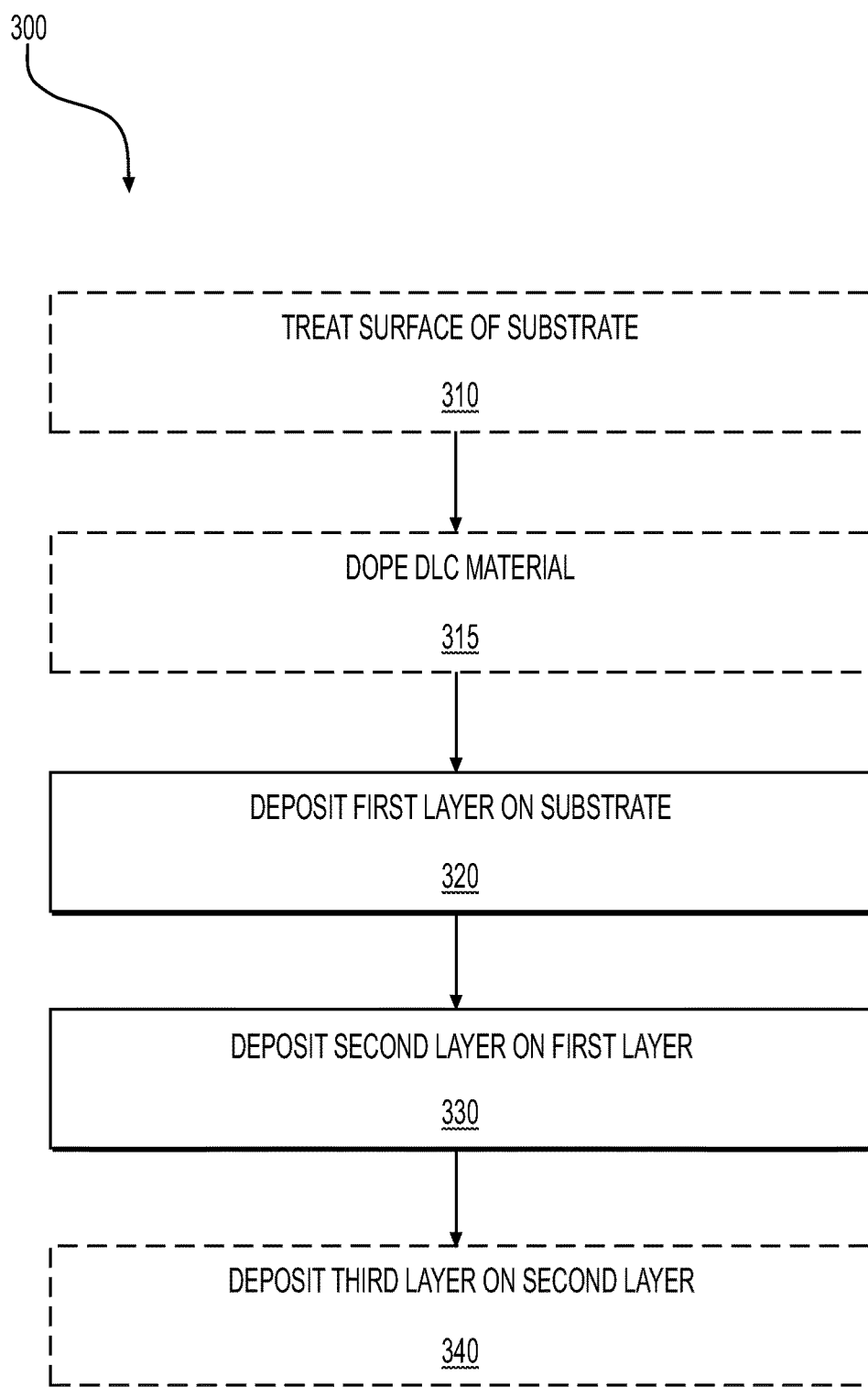
FIG. 3 illustrates a flow diagram showing exemplary steps of a multi-layered DLC coating method.

FIG. 3 illustrates an exemplary flow diagram showing steps of a multi-layered coating method 300 for forming a multi-layered coating on a substrate, such as electronic components. Multi-layered coating method 300 may be used to form multi-layered coating 100 of FIG. 1 or optionally multi-layered coating 200 of FIG. 2.

In an optional step 310, a surface of a substrate is pretreated. In an example of step 310, a printed circuit board is treated with a cleaning process. Exemplary cleaning processes including wiping the circuit board with a lint-free cloth, spraying the circuit board with compressed air or nitrogen gas, applying plasma treatment, and applying an in-situ argon plasma etch under vacuum. The in-situ argon plasma etch helps remove any oxides on metal surfaces and serves as a surface activation technique. DLC deposition may immediately follow the argon plasma etch without breaking vacuum. Other types of treatments may be used depending on the materials of the substrate without departing from the scope hereof. A cleaner substrate surface generally provides better adhesion of the DLC. However, the DLC coating may be deposited directly onto the substrate without any pretreatment of the substrate surface, so long as the substrate surface is substantially clean, since the DLC material bonds well to most substrate materials without pretreatment.

In an optional step 315, a DLC material that is to be used for the first layer 110 and/or third layer 112 is doped. In an example of step 315, a small amount of dopant is added to the DLC material prior to depositing the DLC in first layer 110. The DLC material may be doped prior to deposition. Alternatively, the dopant is added to the DLC material while the DLC layer is being deposited, such that optional step 315 is performed in parallel with a step 320 to deposit first layer 110. The dopant is, for example, silicon, but other dopants may be used without departing from the scope hereof. The dopant material is added in small quantities compared to the amount of carbon. In some embodiments, the dopant material is about 15% of the overall material. In other embodiments, the dopant material less than 1% of the overall material. Doping the DLC material may be used to alter properties of the DLC coating. Doping the DLC material may be used to soften the DLC coating layer thereby reducing formation of microcracks and/or enabling formation of a thicker DLC layer. Doping the DLC material may also be used to improve adhesion of the DLC layer to the substrate.

In a step 320, a first layer 110 is deposited on a substrate 120. In some embodiments, the first layer 110 including DLC is formed by depositing layer upon layer of carbon atoms onto the substrate via chemical-vapor deposition (CVD), plasma-enhanced CVD (PECVD), or ion beam deposition, or a combination thereof. With CVD, volatile hydrocarbons are provided in a low-pressure or high-vacuum chamber for depositing on the substrate. For PECVD, radio-frequency (RF) energy is used to form a plasma in which gas molecules are ionized into their atomic constituents, such that hydrocarbons become ionized hydrogen and carbon atoms. For ion beam deposition, an ion beam source is used to ionize material and direct the material to a target location on the substrate. The resulting material forms a tightly bonded and hydrogenated amorphous carbon structure.

In some embodiments, the first layer 110 is deposited using PECVD and an ion beam source added for enhanced deposition. For example, RF energy is used to form a plasma in which hydrocarbons are ionized into ionized hydrogen and carbon atoms, and an ion beam source accelerates the ions towards the substrate using the same processing gases and vapors as the PECVD process. A biased stage and substrate may be used to draw charged particles to a deposition area. For example, a stage and substrate may have a negative charge applied to attract positively charged ions. The ion beam source may be attached to a port on the deposition chamber used for the PECVD process for enhanced deposition capability. The ion beam enhanced deposition capability enables improved control of coating density and thickness, improved deposition on non-conductive substrates, as well as improved control of $sp^2/sp^3$ properties of the DLC material. For example, ion beam deposition may be used to provide a higher portion of SP2 carbon bonding for improved adhesion to the substrate. In a step 330, a second layer 130 is deposited on top of the first layer 110. Second layer 130 is, for example, a conformal coating that may be deposited using a variety of methods known in the art based on the type of conformal coating material. For example, the substrate 120 with first layer 110 may be dipped in the conformal coating material. Alternatively, the conformal coating forming second layer 130 may be sprayed, brushed, or sputtered on top of the first layer 110. In some embodiments, second layer 130 may be deposited immediately after first layer 110 is deposited on substrate 120, since DLC forms as a dry coating when deposited.

In an optional step 340, a third layer 112 is deposited on top of the second layer 130, as seen in FIG. 2. In some embodiments, third layer 112 is a DLC coating formed by depositing layer upon layer of carbon atoms onto second layer 130 via chemical-vapor deposition (CVD), plasma-enhanced CVD (PECVD), or ion beam deposition, or a combination thereof. A wait time may be performed for drying second layer 130 prior to depositing third layer 112, depending on what type of material is used for second layer 130, what method is used for depositing the material of second layer 130, and a thickness of the second layer 130. In some embodiments, third layer 112 is doped with a dopant via optional step 315. As with first layer 110, the dopant may be added prior to deposition of third layer 112. Alternatively, step 315 is performed in parallel with step 330 such that the dopant is added to the DLC material during the deposition process.

Advantages of using one or more DLC layers in conformal coatings for coating electronic components include the relatively low temperatures at which DLC coatings may be applied. For example, DLC coatings may be applied at temperatures as between about 150° F. and 250° F., which are lower than the melting temperatures of substrates and electronic components. Additionally, the working temperatures of DLC coatings are much higher than their application temperatures ensuring that the DLC coatings will not degrade due to operating temperatures of electronic components. For example, DLC coatings may withstand temperatures as high as about 500° F. without compositional degradation. In some embodiments, DLC coatings may withstand temperatures above 500° F.; however, the DLC material may undergo unwanted compositional changes such as "graphitization".

An additional advantage is that DLC coatings may allow the reduction or elimination of sprayed-on solid film lubricants that traditionally use solvents, thus reducing emissions, hazardous waste, and operator exposure. For example, $MoS_2$ oxidation may be eliminated in non-hermetic environments.

Further embodiments are contemplated in which at least one metallization layer may be included in the multi-layer coating. Said metallization layer may provide electromagnetic shielding and environmental protection, as well as, in some embodiments, further providing thermal shielding to prevent overheating and heat damage. The electromagnetic shielding reduces electromagnetic interference and noise from reaching electronic components associated with the substrate. For example, in environments with large amounts of electronic noise such as in electric vehicles or the like, electronic shielding within the multi-layer coating prevents said electronic noise from interfering with electronic components disposed on the substrate.

Figure 4:
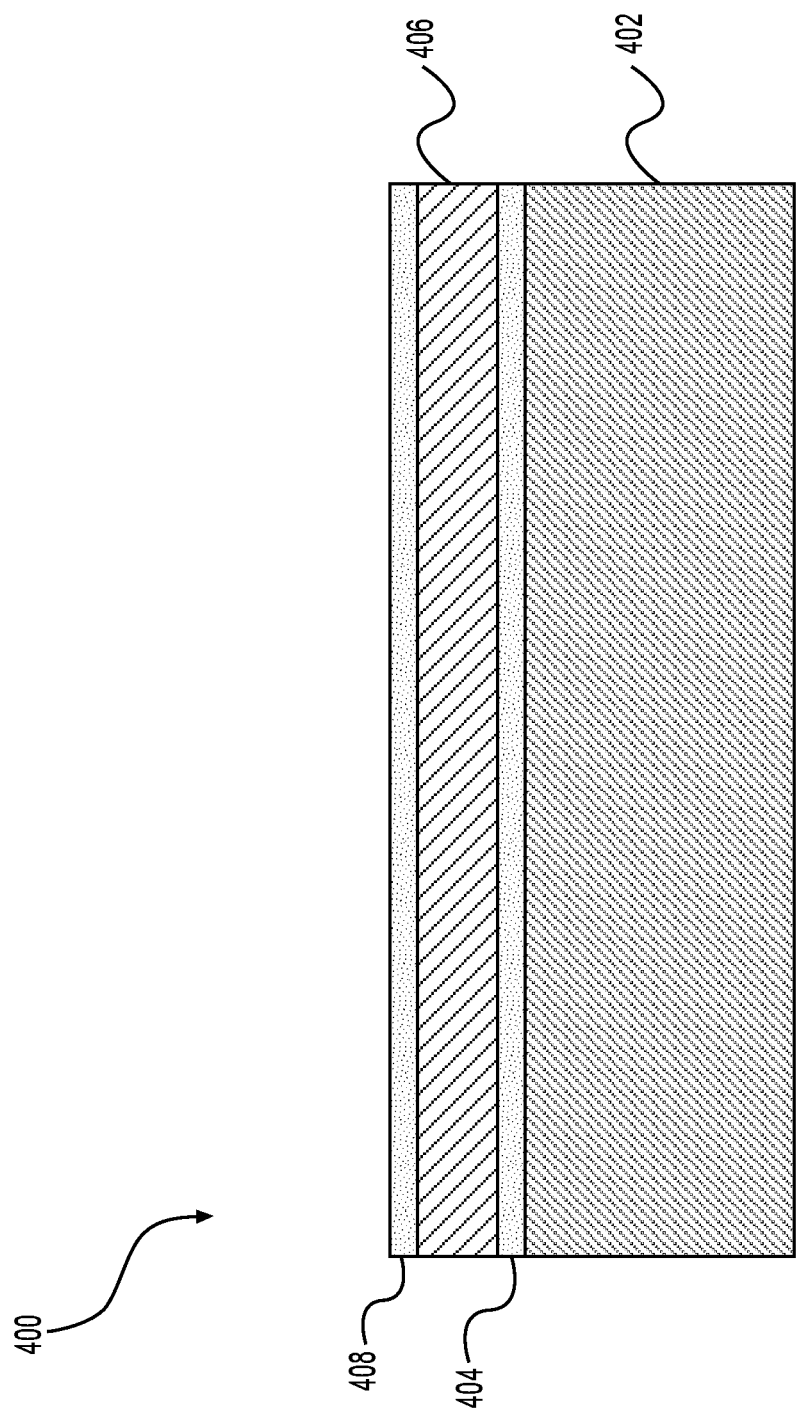
FIG. 4 illustrates an exemplary multi-layered coating for electronic components.

FIG. 4 illustrates an exemplary multi-layered coating 400 applied to a substrate 402 relating to some aspects of the present disclosure. The substrate 402 may be similar to the substrate 120, as described above. For example, in some aspects, the substrate 402 is a non-electrically conductive substrate including a polyurethane material or another suitable form of plastic or epoxy material that is not electrically conductive.

The multi-layer coating 400 includes a DLC layer 404 that is applied externally to the substrate 402 over an outer surface of the substrate 402, as shown. In some such embodiments, the DLC layer 404 includes a carbon material. For example, the DLC layer 404 may include an amorphous carbon material that is free and reactive without a particular crystalline structure. In some embodiments, the DLC layer 404 provides a seal to the outer surface of the electronic component. Additionally, or alternatively, the DLC layer 404 is configured to improve adhesion of one or more subsequent layers of the multi-layer coating 400. For example, the DLC layer 404 may be configured to adhere to a metallization layer 406 applied onto the DLC layer 404, as described in further detail below.

Additionally, embodiments are contemplated in which the DLC layer 404 is replaced with a Plasma Vapor Deposition (PVD) layer. Further, in some embodiments, a PVD layer is included in addition to the DLC layer 404. For example, a plurality of PVD layers may be interlaced with a plurality of DLC layers. In some embodiments, either of the DLC layer 404 or the PVD layer is doped with a softening dopant. For example, the softening dopant may include silicon or another suitable form of semiconductor material or other material suitable for softening the DLC layer 404 or PVD layer. The softening dopant may be added to soften the layer, as described above with respect to the silicon dopant.

The multi-layer coating 400 further includes a metallization layer 406 applied on an outer surface of the DLC layer 404, as shown. The metallization layer 406 provides electromagnetic shielding and environmental protection to either or both of the substrate 402 and the DLC layer 404. For example, in some embodiments, the metallization layer 406 provides electrical grounding for the substrate 402 or an electronic device associated therewith. Here, the metallization layer 406 may ground out one or more electrical signals to prevent electrical interference associated with unwanted electrical signals or electrical noise from reaching the substrate 402 and/or electronic devices disposed on the substrate 402. For example, electrical noise and electromagnetic interference associated with an impedance or from one or more external sources may be prevented from reaching the substrate 402 due to the shielding provided by the metallization layer 406 (or plurality of metallization layers). For example, in some embodiments, the multi-layer coating 400 may be used to prevent electrical interference produced by a battery or other component coupled to or included on the electronic device.

In some embodiments, the metallization layer 406 is relatively flexible as compared to the DLC layer 404. The metallization layer 406 may be applied using any of a variety of suitable techniques such as physical vapor deposition and chemical vapor deposition, as well as plasma deposition techniques. In some such embodiments, a low temperature and low intensity coating technique may be used to apply the metallization layer 406 as to not damage the inner layers of the multi-layer coating 400, the substrate 402, or electronic components associated therewith. Accordingly, coating techniques such as plating and chemical-plating may be avoided to prevent destruction of adhesive layers, substrate, and electronic components, and shorting of electronics.

The multi-layer coating 400 may further include a conformal coating 408 layer disposed on as an outermost layer of the multi-layer coating 400. For example, in some embodiments, the conformal coating 408 is disposed over an outer surface of the metallization layer 406, as shown. The conformal coating 408 may prevent oxidation of the metallization layer 406.

Alternatively, embodiments are contemplated in which the metallization layer 406 is disposed directly to outer surface of the substrate 402 and the DLC layer 404 may not be included or may be disposed external to the metallization layer 406. Further, embodiments are contemplated in which a subsequent DLC layer is included in addition to the DLC layer 404. For example, the subsequent DLC layer may be disposed onto the DLC layer 404 or onto the metallization layer 406. In some embodiments, the subsequent DLC layer is applied to an outer surface of the metallization layer 406 to prevent oxidation of the metallization layer 406.

Figure 5:
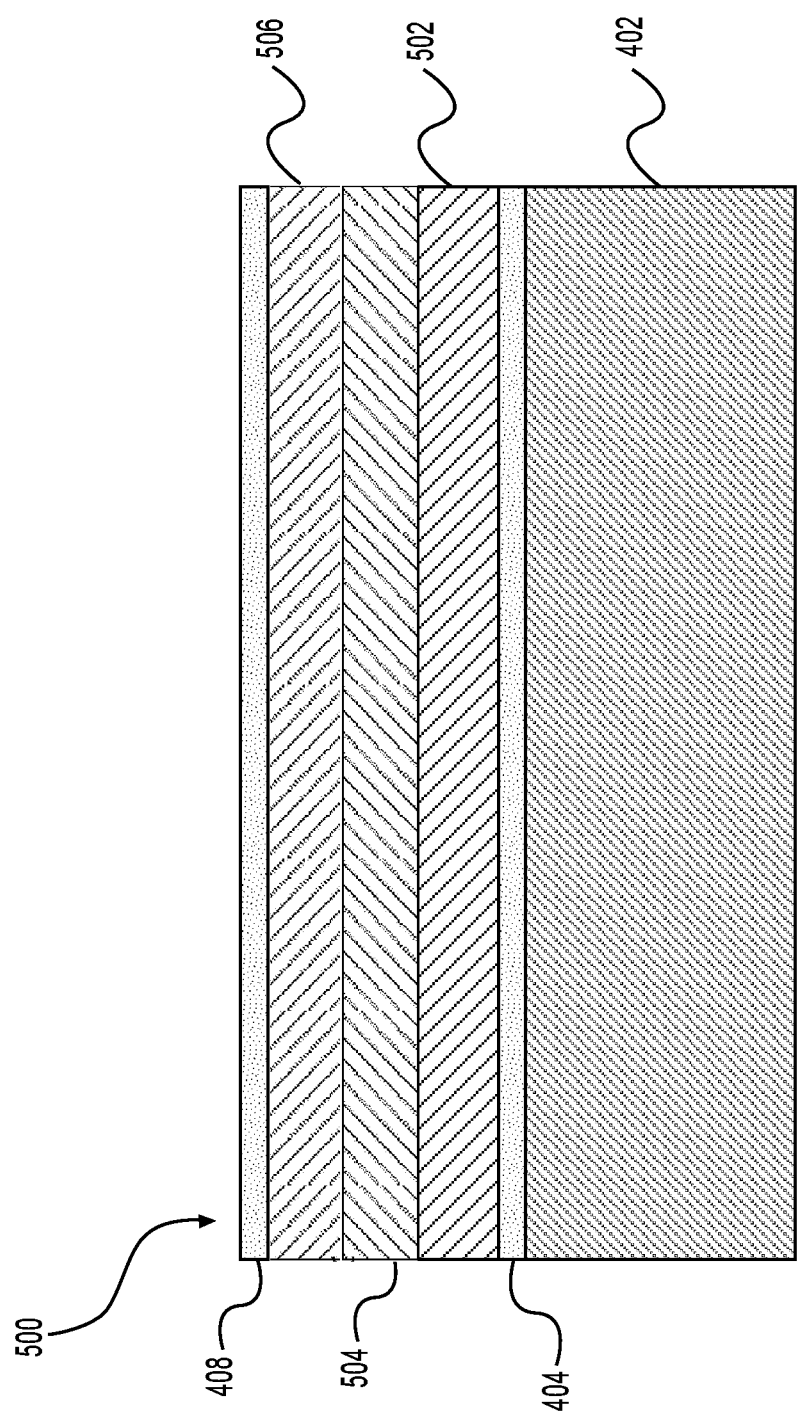
FIG. 5 illustrates an exemplary multi-layered coating for electronic components.

FIG. 5 illustrates another exemplary multi-layer coating 500 applied to the substrate 402 relating to some aspects of the present disclosure. The multi-layer coating 500 may comprise the DLC layer 404 or PVD layer, as described above, that is applied directly over the outer surface of the substrate 402.

The multi-layer coating 500 includes a plurality of metallization layers. For example, in some embodiments, the multi-layer coating 500 includes a first metallization layer 502 disposed over the DLC layer 404 (or in some embodiments, directly over the substrate 402), a second metallization layer 504 disposed over the first metallization layer 502, and a third metallization layer 506 disposed over the second metallization layer 504. In some embodiments, the multi-layer coating 500 includes any number of metallization layers. For example, the multi-layer coating 500 may include two metallization layers, three metallization layers (as shown), or more metallization layers. In some embodiments, the number and/or thickness of the metallization layers may be selected to achieve a particular degree of electromagnetic shielding.

In some embodiments, the first metallization layer 502 includes a first metal material, the second metallization layer 504 includes a second metal material that is distinct from the first metal material, and the third metallization layer 506 includes a third metal material that is distinct from the first metal material and the second metal material. Further, embodiments are contemplated in which multiple layers may be included that comprise similar materials. For example, in some embodiments, two or more layers may be included that consist of the same or similar materials. The metal materials, as described herein, may include any suitable form of pure elemental metal or metal alloy. For example, the metal materials may be selected from any of copper, aluminum, or titanium, as well as other suitable metals not explicitly described herein.

In some embodiments, the multi-layer coating 500 further comprises the conformal coating 408 disposed over the outermost metallization layer (i.e., the third metallization layer 506, as shown). Accordingly, in such embodiments, the conformal coating 408 provides protection to the plurality of metallization layers from oxidation.

In some embodiments, the overall thickness of the multi-layer coating 500 is less than 20 microns. For example, the thickness of each individual layer of the multi-layer coating 500 may be less than approximately 8 microns. Further, in some embodiments, each metallization layer has a thickness between about 1 micron and about 5 microns. The thin layer thickness contemplated for the multi-layer coating 500 further reduces the overall weight of the multi-layer coating 500 such that the multi-layer coating 500 provides electromagnetic shielding without substantially increasing the weight of the substrate and corresponding electronic device.

In some embodiments, the multi-layer coating as described herein, such as either of the multi-layer coating 400 or the multi-layer coating 500 may be used in a variety of applications. For example, in some embodiments, the multi-layer coating may be used as a noise reduction covering to reduce noise and/or vibration. Further, in some embodiments, the multi-layer coating may be used to provide electromagnetic shielding within an aircraft or terrestrial vehicle. Further still, the multi-layer coating may be used to provide a thermal shield to protect one or more heat sensitive components from heat damage.

Although the invention has been described with reference to the embodiments illustrated in the attached drawing figures, it is noted that equivalents may be employed, and substitutions made herein without departing from the scope of the invention as recited in the claims.

Having thus described various embodiments of the invention, what is claimed as new and desired to be protected by Letters Patent includes the following:

1. A multi-layer coating disposed on an outer surface of a non-conductive substrate, the multi-layer coating comprising:
   at least one diamond-like carbon (DLC) layer applied externally to the outer surface of the non-conductive substrate,
   wherein the at least one DLC layer is doped with a softening dopant;
   at least one metallization layer applied on an outer surface of the at least one DLC layer,
   wherein the at least one metallization layer is configured to provide electromagnetic shielding and environmental protection to the at least one DLC layer and the non-conductive substrate; and
   a subsequent DLC layer disposed on an outer surface of the at least one metallization layer.

2. The multi-layer coating of claim 1, further comprising:
   at least one conformal coating layer disposed on an outer surface of an outermost metallization layer, wherein the at least one conformal coating layer prevents oxidation of the outermost metallization layer.

3. The multi-layer coating of claim 1, wherein the at least one metallization layer is configured to electrically ground one or more electrical signals.

4. The multi-layer coating of claim 1, wherein the at least one metallization layer comprises a plurality of metallization layers.

5. The multi-layer coating of claim 4, the plurality of metallization layers comprising:
   a first metallization layer comprising a first metal material; and
   a second metallization layer comprising a second metal material that is distinct from the first metal material.

6. The multi-layer coating of claim 5, the plurality of metallization layers further comprising:
   a third metallization layer comprising a third metal material that is distinct from the first metal material and the second metal material.

7. The multi-layer coating of claim 6, wherein each of the first metallization layer, the second metallization layer, and the third metallization layer has a thickness of less than 5 microns.

8. The multi-layer coating of claim 1, wherein the non-conductive substrate comprises a non-conductive polyurethane substrate.

9. The multi-layer coating of claim 1, wherein the subsequent DLC layer prevents oxidation of the at least one metallization layer.

10. A substrate comprising a multi-layer coating disposed on an outer surface thereof, the multi-layer coating comprising:
    at least one Plasma Vapor Deposition (PVD) layer applied externally to the outer surface of the substrate,
    wherein the at least one PVD layer is doped with a softening dopant; and
    at least one metallization layer applied on an outer surface of the at least one PVD layer,
    wherein the at least one metallization layer is configured to provide electromagnetic shielding and environmental protection to the substrate,
    wherein the substrate comprises a non-conductive polymer substrate.

11. The substrate of claim 10, wherein the softening dopant comprises silicon.

12. The substrate of claim 10, wherein the at least one metallization layer comprises a copper material.

13. The substrate of claim 10, wherein the at least one metallization layer comprises an aluminum material.

14. The substrate of claim 10, wherein the at least one metallization layer comprises a titanium material.

15. The substrate of claim 10, wherein the at least one metallization layer comprises a metal alloy material.

16. An electronic device comprising:
    an electronic component comprising an outer surface; and
    a multi-layer coating disposed on the outer surface of the electronic component, the multi-layer coating comprising:
       at least one diamond-like carbon (DLC) layer applied externally to the outer surface of the electronic component,
       wherein the at least one DLC layer is doped with a softening dopant;
       at least one metallization layer applied on an outer surface of the at least one DLC layer,
       wherein the at least one metallization layer is configured to provide electromagnetic shielding and environmental protection to the electronic component; and
       a subsequent DLC layer disposed on an outer surface of the at least one metallization layer.

17. The electronic device of claim 16, wherein the multi-layer coating has an overall thickness of less than 20 microns.

18. The electronic device of claim 16, wherein the subsequent DLC layer prevents oxidation of the at least one metallization layer.

19. The electronic device of claim 16, wherein the at least one metallization layer is applied to the DLC layer using a vapor deposition process.

20. The electronic device of claim 16, wherein the DLC layer provides a seal to the outer surface of the electronic component and is configured to adhere to the at least one metallization layer.

* * * * *